United States Patent
Scott (10) Patent No.: US 10,732,787 B2
(45) Date of Patent: Aug. 4, 2020

(54) LIGHTING WALL CONTROLLER WITH CONFIGURABLE USER INTERFACE

(71) Applicant: ABL IP HOLDING LLC, Conyers, GA (US)

(72) Inventor: Jeffrey M. Scott, San Pablo, CA (US)

(73) Assignee: ABL IP HOLDING LLC, Conyers, GA (US)

(*) Notice: Subject to any disclaimer, the term of this patent is extended or adjusted under 35 U.S.C. 154(b) by 77 days.

(21) Appl. No.: 15/916,936

(22) Filed: Mar. 9, 2018

(65) Prior Publication Data

US 2019/0278460 A1  Sep. 12, 2019

(51) Int. Cl.
| | |
|---|---|
| *G06F 15/177* | (2006.01) |
| *G06F 3/0481* | (2013.01) |
| *G06F 3/0488* | (2013.01) |
| *H03K 17/94* | (2006.01) |
| *H03K 17/955* | (2006.01) |
| *H03K 17/96* | (2006.01) |
| *H05B 45/10* | (2020.01) |
| *H05B 45/20* | (2020.01) |
| *H05B 47/19* | (2020.01) |

(52) U.S. Cl.
CPC ........ *G06F 3/04817* (2013.01); *G06F 3/0488* (2013.01); *H03K 17/941* (2013.01); *H03K 17/955* (2013.01); *H03K 17/962* (2013.01); *H05B 45/10* (2020.01); *H05B 45/20* (2020.01); *H05B 47/19* (2020.01)

(58) Field of Classification Search
CPC ........................... G06F 3/04817; G06F 3/0488
USPC ................ 715/863, 736, 740, 742, 744, 746
See application file for complete search history.

(56) References Cited

U.S. PATENT DOCUMENTS

| | | | |
|---|---|---|---|
| 7,115,856 B2 | 10/2006 | Peng et al. | |
| 9,119,239 B2 | 8/2015 | Engel-Hall et al. | |
| 9,462,664 B2 | 10/2016 | Engel-Hall et al. | |
| 2010/0085313 A1* | 4/2010 | Rider | G06F 3/04886 345/173 |

(Continued)

OTHER PUBLICATIONS www.microchip.com/downloads/en/DeviceDoc/00001571B.pdf. Microchip, CAP1298, "8-Channel Capacitive Touch Sensor Controller with Proximity Detection & Signal Guard," Microchip Technology Inc., DS00001571B, pp. 1-68 (2013-2015).

(Continued)

*Primary Examiner* — Andrey Belousov
(74) *Attorney, Agent, or Firm* — RatnerPrestia (57) ABSTRACT

A wall controller controls lighting in an area based upon a configurable user interface. The wall controller includes touch and gesture sensing electrodes mounted to a substrate, and an overlay mounted over the touch and gesture sensing electrodes. The overlay includes firmware to define lighting functions relative to a touch or motion gesture on the overlay. A processor is coupled to receive at least one of sensing signals based upon user touch inputs on the overlay, or sensing signals based upon user motion gestures near the overlay. Programming in a memory configures the processor to analyze the received sensing signals in accordance with the firmware of the overlay, generate a lighting control message based upon the analyzed sensing signals, and transmit the lighting control message to one or more luminaires in an area of the wall controller to control an output of the one or more luminaires.

25 Claims, 8 Drawing Sheets

(56) References Cited

U.S. PATENT DOCUMENTS

| | | | | |
|---|---|---|---|---|
| 2010/0289752 A1* | 11/2010 | Birkler | ............... | G06F 1/1626 |
| | | | | 345/173 |
| 2014/0380234 A1* | 12/2014 | Shim | ................. | G06F 3/0482 |
| | | | | 715/781 |
| 2015/0319006 A1* | 11/2015 | Plummer | ............ | H04L 12/2827 |
| | | | | 700/83 |
| 2016/0195973 A1* | 7/2016 | Ficner | ................. | G06F 3/0416 |
| | | | | 345/174 |
| 2017/0117891 A1 | 4/2017 | Lohbihler et al. | | |

OTHER PUBLICATIONS https://www.microchip.com/wwwproducts/MGC3030, "MGC3030/3130 3D Tracking and Gesture Controller Data Sheet," MGC3030/3130, Microchip Technology Inc., DS40001667E, pp. 1-50 (2012-2017).

http;//www.microchip.com/design-centers/capacitive-touch-sensing/gestic-technology/over . . . , Microchip: GestIC Technology, "Microchip's Advanced Multi-Touch Controller", printed Feb. 15, 2018 (3 pages).

http://www.microchip.com/design-centers/capcitive-touch-sensing/gestic-technology/over . . . , Microchip; GestIC Technology, "Gesture Control; Simplicity", Printed Feb. 15, 2018 (3 pages).

\* cited by examiner

LIGHTING WALL CONTROLLER WITH CONFIGURABLE USER INTERFACE

TECHNICAL FIELD

The present subject matter relates to techniques and equipment for touch and touchless input control of lighting using a wall controller with a configurable user interface.

BACKGROUND

Electrical powered artificial lighting has become ubiquitous in modern society. Electrical lighting devices are commonly used, for example, in homes, hospitals, buildings of commercial and other enterprise establishments, as well as in various outdoor settings. Traditional light fixtures or luminaires have tended to be relatively dumb, in that they are turned ON and OFF, and in some cases dimmed, usually in response to user activation of a relatively simple input device.

Since the advent of electronic light emitters, such as lighting emitting diodes (LEDs), for general lighting type illumination application, lighting equipment has become increasingly intelligent with incorporation of sensors, programmed controller and network communication capabilities. Automated control, particularly for enterprise installations, may respond to a variety of sensed conditions, such as daylight or ambient light level and occupancy. The controllers for existing systems have fixed interfaces or limited configurability that forces users and designers of the systems to have to choose sub-optimal solutions for lighting systems operations. The limited configurability of controllers drives up costs and is inconvenient if the user needs to make a subsequent change after the initial design, which would increase cost to order additional hardware and cause down time while waiting for delivery of the newly configured component and its installation.

A need exists for providing an improved interface module for controllers in lighting systems.

SUMMARY

The concepts disclosed herein alleviate problems and/or improve over prior lighting technology, for example, for changing the appearance and functionality of the user interface of a wall controller of a lighting system. The technology examples discussed in more detail below offer a wall controller with a configurable overlay assembly that provides a way to customize a user interface of the wall controller.

An example wall controller for lighting may include touch sensing electrodes, gesture sensing electrodes, a lighting network data communication interface, and an overlay mounted over the touch sensing and gesture sensing electrodes, wherein the overlay includes firmware to define lighting functions relative to a touch or motion gesture on the overlay. The touch sensing electrodes and gesture sensing electrodes are mounted to a substrate. A capacitive touch driver and sensing circuit are coupled to the touch sensing electrodes, and a capacitive gesture driver and sensing circuit are coupled to the gesture sensing electrodes. The wall controller may further include a processor coupled to receive at least one of sensing signals, based upon user touch inputs at a location on the overlay and defined by the firmware of the overlay, from the capacitive touch driver and sensing circuit or sensing signals, based upon user motion gestures of a type near the overlay and defined by the firmware of the overlay, from the capacitive gesture driver and sensing circuit. Memory is coupled to be accessible to the processor. The memory stores programming for execution by the processor and data to be saved or processed by the processor during execution of instructions included in the programming. Execution of the programming in the memory configures the processor to: analyze the at least one sensing signals received from the capacitive touch and gesture drivers and sensing circuits; generate a lighting control message based upon the analyzed sensing signal; and transmit the lighting control message to one or more luminaires in an area of the wall controller to control an output of the one or more luminaires.

In another example, a system includes a data network, a plurality of luminaires, and a wall controller configured for mounting in a standard electrical box through an opening in a structural architectural panel. The plurality of luminaires include a light source, driver circuitry coupled to the light source to provide power to the light source, a lighting control device coupled to the driver circuitry to control a light output and operations of the light source, and a network interface to enable the light fixture to receive communication via the data network. The wall controller includes touch sensing and gesture sensing electrodes mounted to a substrate, a capacitive touch driver and sensing circuit coupled to the touch sensing electrodes, a capacitive gesture driver and sensing circuit coupled to the gesture sensing electrodes, an overlay mounted over the touch sensing and gesture sensing electrodes, the overlay including firmware to define lighting functions relative to a touch or motion gesture on the overlay, and a lighting network data communication interface to enable the wall controller to communicate with the plurality of luminaires. The wall controller may further include a processor coupled to receive at least one of sensing signals, based upon user touch inputs at a location on the overlay and defined by the firmware of the overlay, from the capacitive touch driver and sensing circuit or sensing signals, based upon user motion gestures of a type near the overlay and defined by the firmware of the overlay, from the capacitive gesture driver and sensing circuit. Memory is coupled to be accessible to the processor. The memory stores programming for execution by the processor and data to be saved or processed by the processor during execution of instructions included in the programming. Execution of the programming in the memory configures the processor to: analyze the at least one sensing signals received from the capacitive touch and gesture drivers and sensing circuits in accordance with the firmware of the overlay; generate a lighting control message based upon the analyzed sensing signal; and transmit the lighting control message to one or more luminaires in an area of the wall controller to control an output of the one or more luminaires.

In another example, a method for controlling lighting includes receiving at least one of sensing signals, based upon user touch inputs at a location on an overlay mounted over touch sensing and gesture sensing electrodes of a wall controller and defined by firmware of the overlay, from a capacitive touch driver and sensing circuit or sensing signals, based upon user motion gestures of a type near the overlay and defined by the firmware of the overlay, wherein the firmware defines lighting functions relative to a touch or motion gestures on the overlay; analyzing the at least one sensing signals received from the capacitive touch driver and capacitive sensing circuit or the capacitive gesture driver and sensing circuit; generating a lighting control message based upon the analyzed sensing signals; and transmitting the lighting control message to at least one of a plurality of luminaires in an area to control and output from a light source of the at least one of the plurality of luminaires. The analyzing of the received sensing signal includes ascertaining from which of the touch sensing electrodes or the gesture sensing electrodes a user input was sensed to generate the sensing signals; and determining a lighting function of the sensed user input based upon a predetermined lighting profile configuration of the touch sensing and gesture sensing electrodes and the overlay. The touch sensing electrodes and gesture sensing electrodes are mounted to a substrate of a wall controller configured to be mounted in a standard electrical box through an opening in a structural architectural panel.

Additional advantages and novel features of the examples will be set forth in part in the description which follows, and in part will become apparent to those skilled in the art upon examination of the following and the accompanying drawings or may be learned by production or operation of the examples. The advantages of the present subject matter may be realized and attained by means of the methodologies, instrumentalities and combinations particularly pointed out in the appended claims.

BRIEF DESCRIPTION OF THE DRAWINGS

The drawing figures depict one or more implementations in accordance with the present concepts, by way of example only, not by way of limitations. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The term "luminaire," as used herein, is intended to encompass essentially any type of device that processes energy to generate or supply artificial light, for example, for general illumination of a space intended for use of occupancy or observation, typically by a living organism that can take advantage of or be affected in some desired manner by the light emitted from the device. However, a luminaire may provide light for use by automated equipment, such as sensors/monitors, robots, etc. that may occupy or observe the illuminated space, instead of or in addition to light provided for an organism. However, it is also possible that one or more luminaires in or on a particular premises have other lighting purposes, such as signage for an entrance or to indicate an exit. In most examples, the luminaire(s) illuminate a space or area of a premises to a level useful for a human in or passing through the space, e.g. general illumination of a room or corridor in a building or of an outdoor space such as a street, sidewalk, parking lot or performance venue. The actual source of illumination light in or supplying the light for a luminaire may be any type of artificial light emitting device, several examples of which are included in the discussions below.

The term "wall controller," as used herein, is intended to encompass any type of device, component, or combination thereof that communicates with a lighting system to control operations of luminaires, for example, turning the luminaires on/off, adjusting a dimming level, or any other preset function that may be based on executable software or hardware program code. The wall controller is typically located within a lighting zone and provides a user of the lighting system with the ability to control lighting within the zone. The wall controller is not limited to wall mounting and may be arranged on any surface or as a mobile device, such as a laptop computer or tablet, that allow communication with the luminaires of the lighting system.

Terms such as "artificial lighting," as used herein, are intended to encompass essentially any type of lighting that a device produces light by processing of electrical power to generate the light. An artificial lighting device, for example, may take the form of a lamp, light fixture, or other luminaire that incorporates a light source, where the light source by itself contains no intelligence or communication capability, such as one or more LEDs or the like, or a lamp (e.g. "regular light bulbs") of any suitable type. The illumination light output of an artificial illumination type luminaire, for example, may have an intensity and/or other characteristic(s) that satisfy an industry acceptable performance standard for a general lighting application.

The term "coupled" as used herein refers to any logical, optical, physical or electrical connection, link or the like by which signals or light produced or supplied by one system element are imparted to another coupled element. Unless described otherwise, coupled elements or devices are not necessarily directly connected to one another and may be separated by intermediate components, elements or communication media that may modify, manipulate or carry the light or signals.

Light output from the luminaire may carry information, such as a code (e.g. to identify the luminaire or its location) or downstream transmission of communication signaling and/or user data. The light based data transmission may involve modulation or otherwise adjusting parameters (e.g. intensity, color characteristic or distribution) of the illumination light output from the device.

Figure 1:
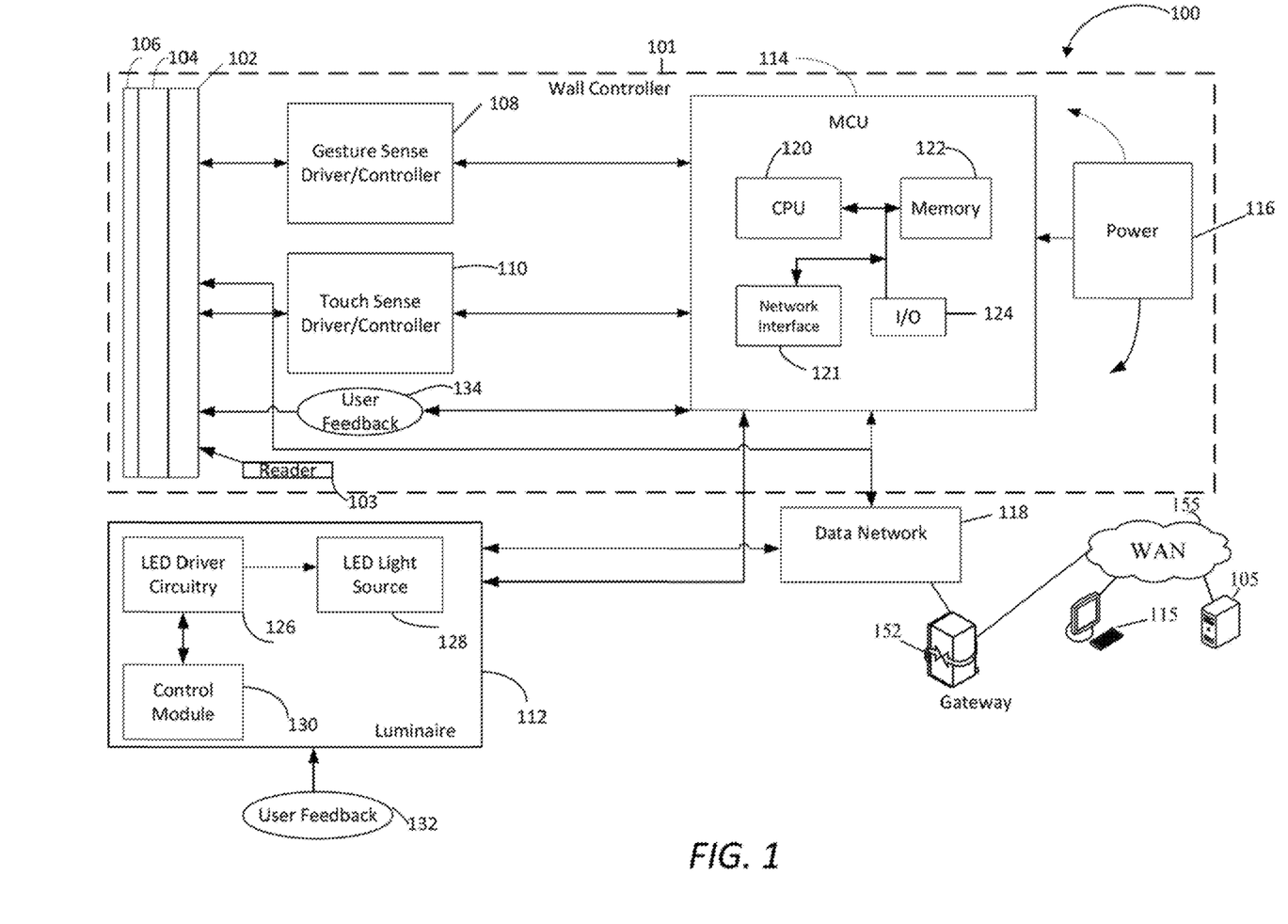
FIG. 1 is a simplified block diagram illustrating an example of a lighting system and devices, including a wall controller that provides a configurable user interface to control a light source of a luminaire.

Reference now is made in detail to the examples illustrated in the accompanying drawings and discussed below. FIG. 1 illustrates a simplified block diagram illustrating an example of a lighting system and devices including a wall controller that provide a configurable user interface to control a light source of a luminaire.

In FIG. 1, a lighting system 100 using, for example, a data network 118 and devices that provide a variety of lighting capabilities, including communication in support of lighting functions such as turning lights on/off, dimming, or other system control functions, utilizing a wall controller 101 with touch and touchless sensing capabilities, for example, to control an output of a light source 128 of luminaire 112. The wall controller and luminaire in the lighting system 100 may be, for example, Acuity Brands Lighting nLight® enabled devices, meaning the devices are networked together and have the ability to communicate over an nLight® network using a software application such as SensorView. Alternatively, the devices of the lighting system 100 are not limited by the nLight® network, and may be configured to communicate using another backbone network architecture and protocol known in the art, for example, 0-10 v, Digital Addressable Lighting (DALI), BACnet, DMX, RDX, Phase-Cut, etc. . . . Communications may use any suitable wired or wireless media.

Luminaire 112 includes a controller 130 (e.g., a Control module or micro-control unit) that executes a lighting application for wired communication via wired links, in an example, and over a data network 118 such as a local area network (LAN) or the like, of control and systems operations information during control network operations over the data network 118 and during associated touch and touchless sensing by the wall controller. Optionally, each of the devices of lighting system 100 are connected to gateway 152 via the network 118.

CAT5e type cabling may be used between the devices for the wired communications via the LAN. The cable type example of the data network 118 may use any available standard data communication technology, such as Ethernet, RS485, PLC or the like.

Alternatively, the lighting system 100 may use a wireless communication architecture in which case the data network 118 could serve as a wireless access point with each component of the system 100 being connected directly to the same network 118 without having to access a gateway. The wireless example of the data network 118 may use any available standard wireless data communication technology, such as WiFi, Bluetooth Low Energy (BLE), Z-wave, LiFi, sub-GHz, etc. Li-Fi is a form of visible light communication and a subset of optical wireless communication (OWC), and uses light from light-emitting diodes (LEDs) as a medium to deliver networked, mobile, high-speed communication in a similar manner to WiFi with the exception that WiFi utilizes radio waves, while LiFi uses visible light. Alternatively, the wireless network may use a proprietary protocol implemented by nLight Air® products.

The luminaire 112 is illustrated in FIG. 1 as a single unit; however, a plurality of luminaires may be provided in the lighting system 100. The lighting system 100 may be in any location or locations serviced for lighting and other purposes by a networked intelligent lighting system of the type described herein. The luminaire or luminaires 112 are located to provide lighting service in various areas in or about the area of a wall controller. Most of the examples discussed below focus on building installations, for convenience, although the system may be readily adapted to outdoor lighting. Hence, the lighting system 100 provides lighting and possibly other services, for example, HVAC and other building management services in a number of service areas in or associated with a building, such as HVAC, surveillance, door access, etc., to various rooms, hallways, corridors, or storage areas of a building and an outdoor area associated with the building. Any building forming or at the premises, for example, may be an individual or multi-tenant resident dwelling or may provide space for one or more enterprises and/or any combination of residential, office and enterprise facilities.

In the example of FIG. 1, the wall controller 101 includes a substrate 102, an arrangement of gesture and touch sensing electrodes 104, an overlay 106, and a reader 103 arranged on the substrate 102 to read firmware of storage media (discussed below) associated with the configurable overlay 106 so that the touch and gesture motions detected by the gesture and touch sensing electrodes 104 correspond to a predefined function to control operation of the luminaires in the lighting system. The wall controller 101 further includes a micro-control unit (MCU) 114 that is accessible to the luminaire 112. As illustrated in FIG. 1, the MCU 114 is coupled to communicate and process data received from the luminaire 112 via input/output (I/O) interface 124 as well as touch and touchless data related to electrodes 104 that is received from gesture sense driver/controller 108 and touch sense driver/controller 110. MCU 114 includes a memory 122 (volatile and non-volatile) and a central processing unit or "CPU" 120 that are coupled to each other and the I/O interface 124 via internal data links. The CPU 120 is also coupled to communicate via the network interface 121 and the network link with one or more others of the luminaires 112 or devices of the lighting system 100, in the example, via the data network 118. The MCU 114 and the CPU 120 may be implemented via hardwired logic circuitry, but in the examples, the processor is a programmable processor such as a central processing unit (CPU) 120 of a microcontroller or microprocessor. The memory 122 stores programming for execution by the CPU 120 of the micro-control unit 114 and data that is available to be processed or has been processed by the CPU 120. The memory 122, for example, may include a lighting application (which can be firmware) for lighting control and management operations. Execution of the programming by the CPU 120 configures the wall controller 101 to perform the functions or procedures as described below, for example, in FIG. 8. The CPU, the memory, the I/O, and the network interface of the MCU 114 typically are all included on a single chip and sometimes referred to as a "system on a chip" or SoC. Although shown separately, other elements of the circuitry of the wall controller, such as either one or both of the sense driver/controllers, may be included on the same SoC.

The lighting system 100 may comprise a mix and match of various indoor systems, wired lighting systems (e.g., nLight® wired), or wireless lighting systems (e.g., nLight® Air), emergency, and outdoor products that are networked together to form a collaborative and unified lighting solution or building management systems. Additional control devices and lighting fixtures, gateway(s) 114 for backbone connection, time sync control, data collection and management capabilities, and interoperation with Acuity Brands Lighting's commercially available SensorView product may also be provided.

Figure 2:
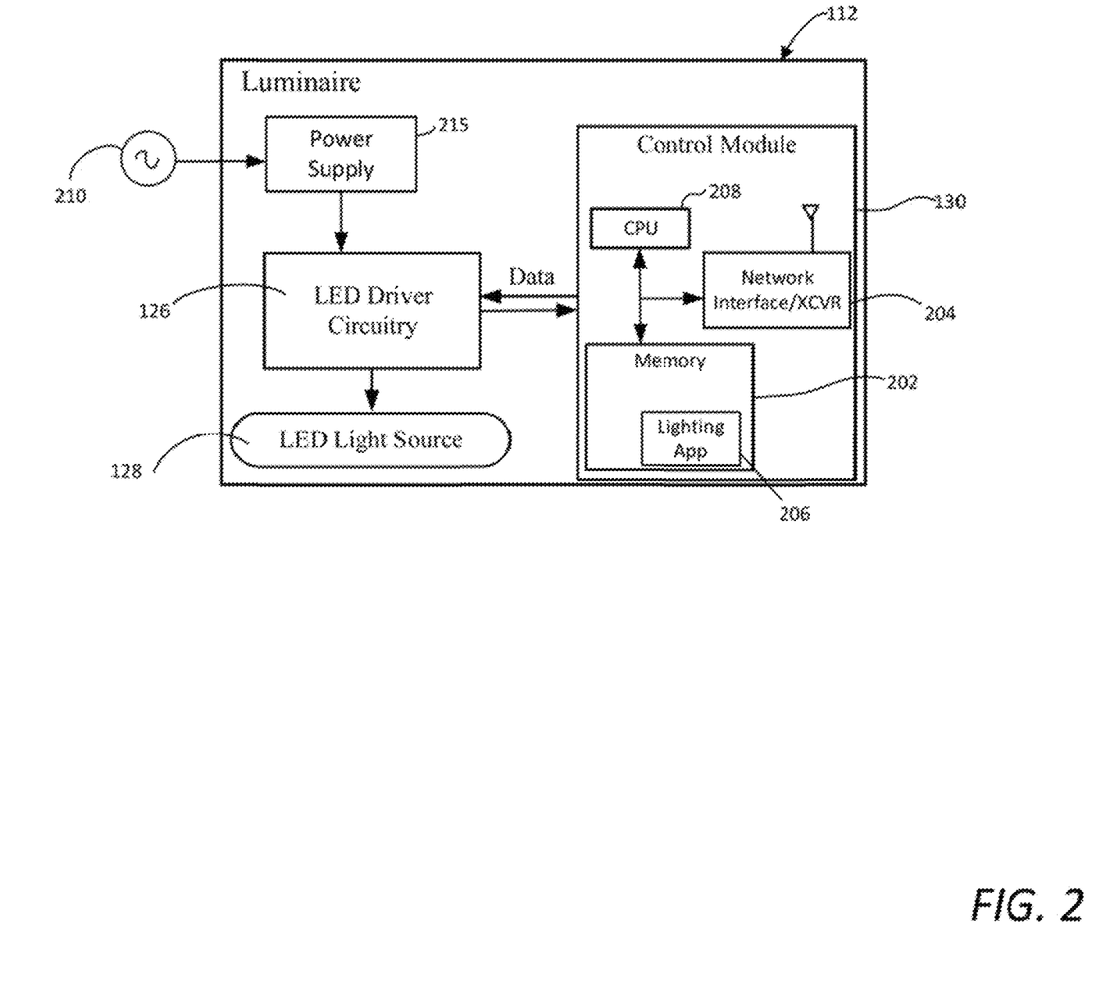
FIG. 2 is a block diagram of a luminaire that operates in and communicates via the lighting system of FIG. 1.

FIG. 2 is a block diagram of a luminaire that operates in and communicates via the lighting system of FIG. 1. Luminaire 112 is an integrated lighting device that generally includes a power supply 215 driven by a power source 210. Power supply 215 receives power from the power source 210, such as an AC main, battery, solar panel, or any other AC or DC source. Power supply 215 may include a magnetic transformer, electronic transformer, switching converter, rectifier, or any other similar type of circuit to convert an input power into a power signal suitable for luminaire 112.

Luminaire 112 further includes LED driver circuitry 126, control module 130, and, a light source which is, for example, a light emitting diode (LED) light source 128. In most examples, the luminaire 112 illuminates a service area to a level useful for a human in or passing through the space, e.g. regular illumination of a room or corridor in a building, such as a store, and/or provide an indoor visible light source based positioning system. For purposes of example, the light source 128 is illustrated and described as a LED-type light; however, the light source 128 may be virtually any type of light source suitable to providing the intended type of light output that may be electronically controlled. The light source 128, for example, may provide visible light output as providing visible illumination for human occupancy or the like and/or visible light source based positioning. The light source 128 may be of the same general type in all of the luminaires that would be in the area, e.g. all formed by some number of light emitting diodes (LEDs); although in many installations, some number of the luminaires may have different types of light sources 128, e.g. some use LEDs, some use compact or tube type fluorescent sources, etc.

LED driver circuitry 126 is coupled to LED light source 128 and drives the LED light source 128 by regulating the power to the LED light source 128 by providing constant quantity or power LED light source 128 as its electrical properties change with temperature, for example. The LED driver circuitry 126 includes a driver circuit that provides power to LED light source 128. LED driver circuitry 126 may be a constant-voltage driver, constant-current driver, or AC LED driver type circuit that provides dimming through a pulse width modulation circuit and may have many channels for separate control of different LEDs or LED arrays.

LED driver circuitry 126 can further include an AC or DC current source or voltage source, a regulator, an amplifier (such as a linear amplifier or switching amplifier), a buck, boost, or buck/boost converter, or any other similar type of circuit or component. LED driver circuitry 126 outputs a variable voltage or current to the LED light source 128 that may include a DC offset, such that an average value is nonzero, and/or an AC voltage.

Control Module 130 is coupled to the LED driver circuitry 126 and controls the light source operation of the LED light sources 128. Control Module 130 includes a memory 202 (volatile and non-volatile) and a central processing unit (CPU) 208 that are coupled by a network interface 204. The CPU 208 may also be coupled to communicate via the network interface 204 and the network link with one or more others of the luminaires or devices of the system of FIG. 1. The CPU 208 may be implemented via hardwired logic circuitry, but in the examples, the processor is a programmable processor such as a central processing unit (CPU) 208 of a microcontroller or a microprocessor. The memory 202 stores programming for execution by the CPU 208 of the Control Module 130 and data that is available to be processed or has been processed by the CPU 208. The memory for example, may include a lighting application 206 (which can be firmware) for lighting control and management operations. The processors and memories in the luminaire may be substantially the same throughout the luminaires 112 in an area or space, or different luminaires 112 may have different processors 208 and/or different amounts of memory 202, depending on differences in intended or expected processing needs.

The network interface 204 in each luminaire 112 in a particular service area will be of a physical type and configured to operate in a manner that is compatible with the physical media and electrical protocol(s) implemented for the particular service area and/or throughout the premises of the system. Although FIG. 2 shows the luminaire 112 having one network interface 204, some or all of the luminaires 112 may have two or more network interfaces 204 to enable data communications over different media with the network(s) and/or with other devices in the vicinity.

In the examples, the control module 130 and the network interface 204 are integrated with the other elements of the luminaire 112, or attached to the luminaire 112 or other elements that incorporate the light source 128. However, for some installations, the light source 128 may be attached in such a way that there is some separation between the luminaire and other element that incorporate the electronic components that provide the intelligence and communication capabilities. For example, the communication components and possibly the CPU 208 and memory 202 may be elements of a separate device or component coupled and/or collocated with the luminaire 112.

Figure 3:
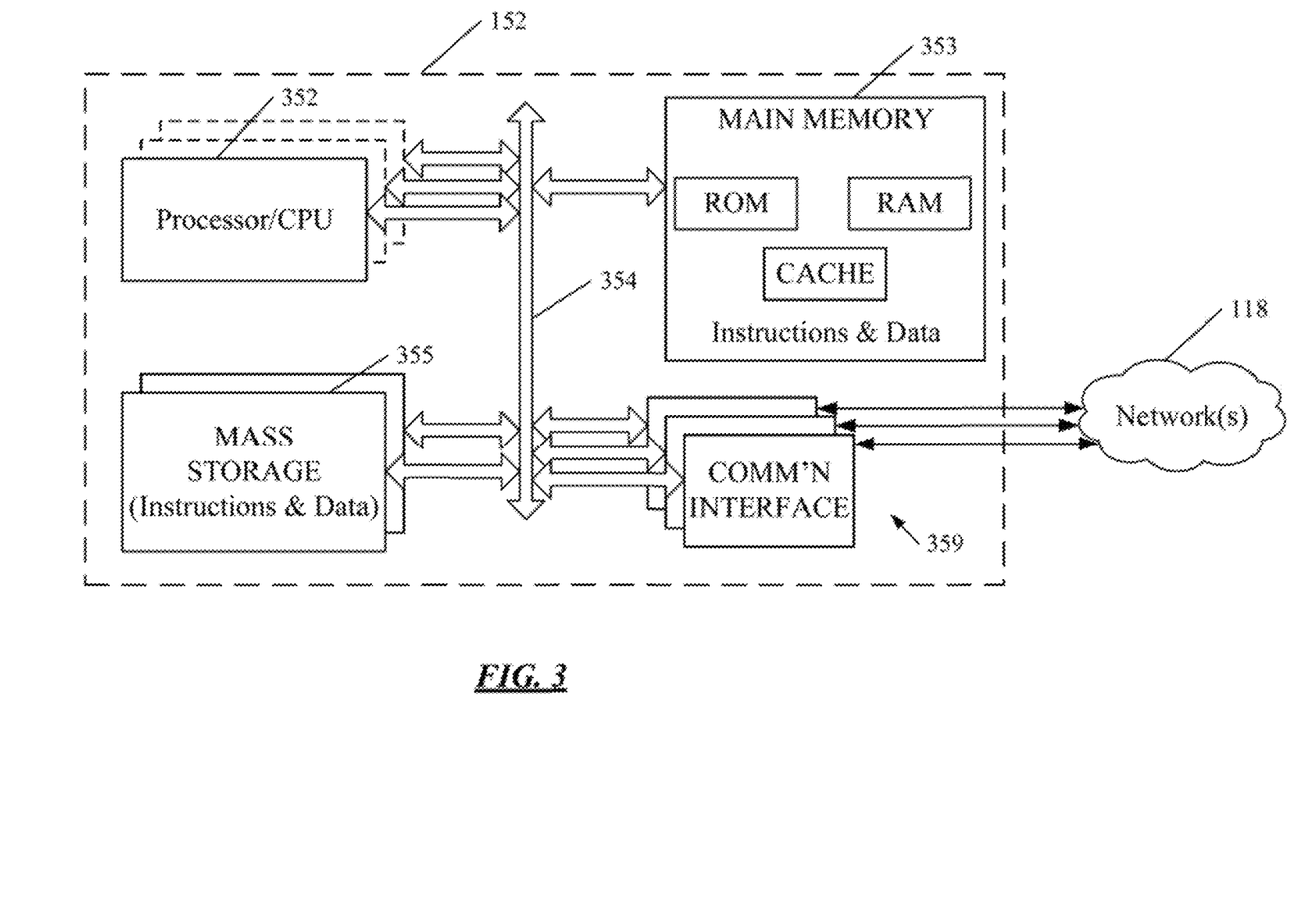
FIG. 3 is a simplified block diagram of a computer that may be configured as a host or server, for example, to function as the gateway or server in the system of FIG. 1.

FIG. 3 is a simplified block diagram of a computer that may be configured as a host or server, for example, to function as the gateway 152 or server in the system of FIG. 1.

The example gateway 152 will generally be described as an implementation of a server computer. Alternatively, the computer system may comprise a mainframe or other type of host computer system capable of web-based communications, media content distribution, or the like via the data network 118.

The gateway 152 in the example includes a central processing unit (CPU) 352, a main memory 353, mass storage 355, and an interconnect bus 354. The circuitry forming the CPU 352 may contain a single microprocessor, or may contain a number of microprocessors for configuring the gateway 152 as a multi-processor system, or may use a higher speed processing architecture. The main memory 353, in the example, includes ROM, RAM and cache memory; although other memory devices may be added or substituted. Although semiconductor memory may be used in the mass storage 355, magnetic type devices (tape or disks) and optical disk devices typically provide higher volume storage in host computer or server application. In operation, main memory 353 is accessible to CPU 352 and stores at least portions of instructions and data for execution by the CPU 352, although instructions and data are moved between memory and storage and CPU 352 via the interconnect bus 354.

The gateway 152 also includes one or more input/outputs interfaces for communications, shown by way of example as interfaces 359 for data communications via the data networks 118 and 155. Each interface 359 may be a high-speed modem, an Ethernet (optical, cable or wireless) card or any other appropriate data communications device.

The gateway 152 runs a variety of applications programs and stores the necessary information for support of an interchangeable overlay plate for the wall controller described herein. One or more such applications, such as the light management software application SensorView, manage light functions of the luminaires based upon sensed touch and touchless data obtained from using an interchangeable overlay plate on a wall controller. Those skilled in the art will recognize that the gateway 152 may run other programs and/or host other light management functions.

In an example, the lighting system 100 is installed at a building premises. The system 100 also includes a data communication or wireless controller network 118 that interconnects the links to/from the network communication interfaces of the luminaire 112 and wall controller including a substrate 102, gesture sensing and touch sensing electrodes 104 and a configurable overlay 106, so as to provide data communications amongst the luminaire 112. The data network 118 may support data communication by equipment at the premises via wired (e.g. cable or fiber) media or via wireless (e.g. WiFi, Bluetooth, ZigBee, Z-wave, etc.) or combinations of wired and wireless technology. Such a data network 118, for example a short range or local area network (LAN), also is configured to provide data communications for at least some of the light fixtures luminaires 112 and other equipment at the premises (not shown), and via a data network 155 outside the premises, shown by way of example as a wide area network (WAN), so as to allow the luminaire 112 at the premises to communicate with outside devices such as the server/host computer 105 and the user terminal device 115.

Figure 4:
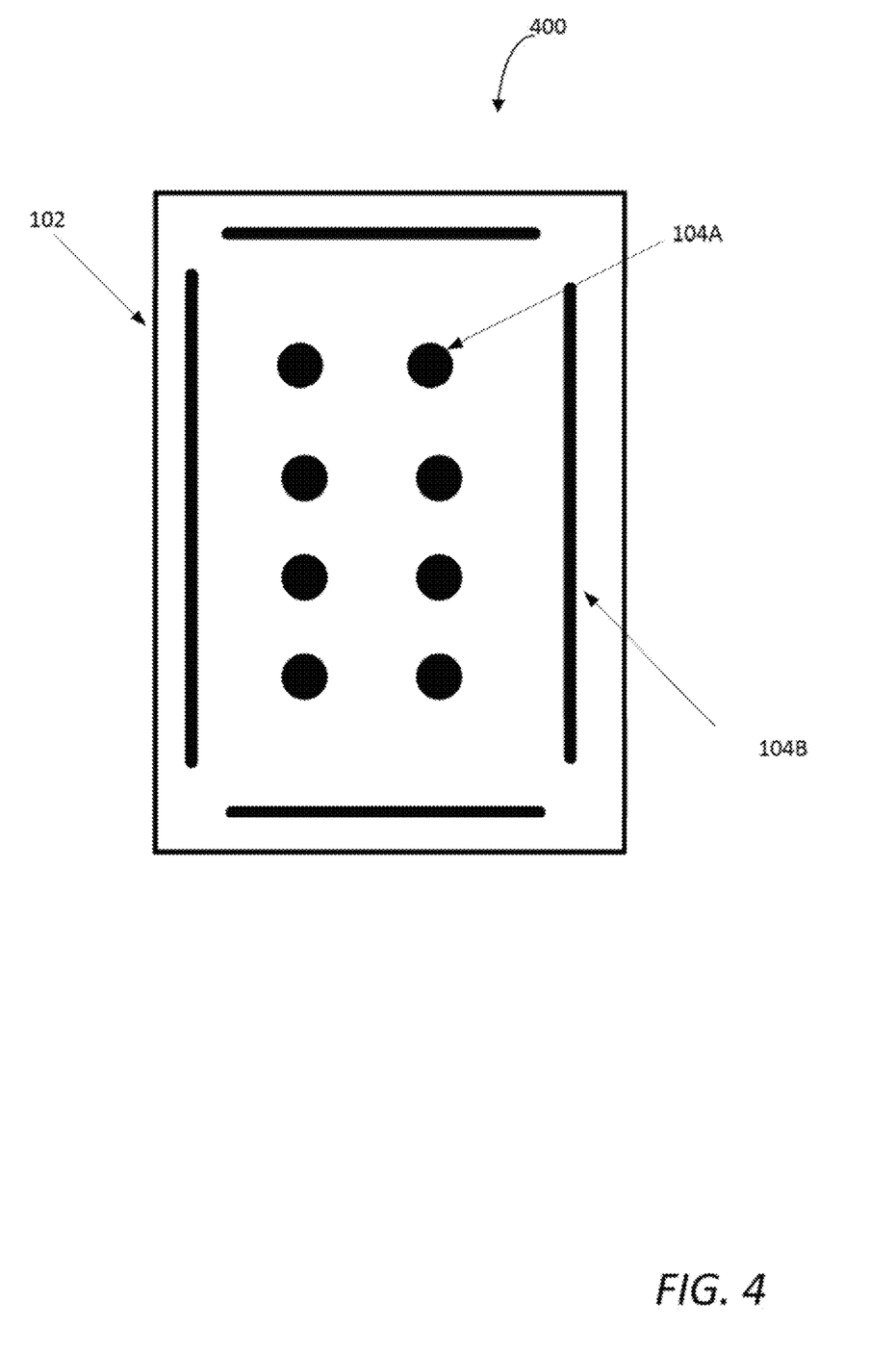
FIG. 4 is a simplified diagram of the touch sensing and gesture sensing electrodes on a printed circuit board.

FIG. 4 is a simplified diagram of touch sensing and gesture sensing electrodes on a substrate or printed circuit board (PCB). In FIG. 4, a plurality of electrodes are arranged on a substrate or PCB 102. The plurality of electrodes include touch sensing capacitive electrodes 104A which are arranged in a middle or central area of the substrate 102, and gesture sensing electrodes 104B which are arranged around a perimeter of the substrate 102. The touch sensing capacitive electrodes 104A may be any self-capacitance configuration type known in the art to provide a variety of button and proximity functionality, for example, a CAP1298 Microchip capacitive touch sensor. The gesture sensing electrodes 104B may be any sensors that use electric field (E-field) sensing to detect near field gestures from conductive objects such as the human body, for example, a MGC3030/3130 Microchip. In FIG. 4, at least four (4) gesture sensing electrodes 104B are arranged around the perimeter of substrate 102 with, for example, eight (8) touch sensing capacitive electrodes 104A in the middle or central area of the substrate 102 and surrounded by the gesture sensing electrodes 104B. Alternatively, an additional fifth ($5^{th}$) gesture sensing electrode may be arranged in the central area of the substrate 102 with the touch sensing capacitive electrodes 104A, for example, one gesture sensing electrode in each of a north, south, east, west and center area of the substrate 102.

Figure 5A:
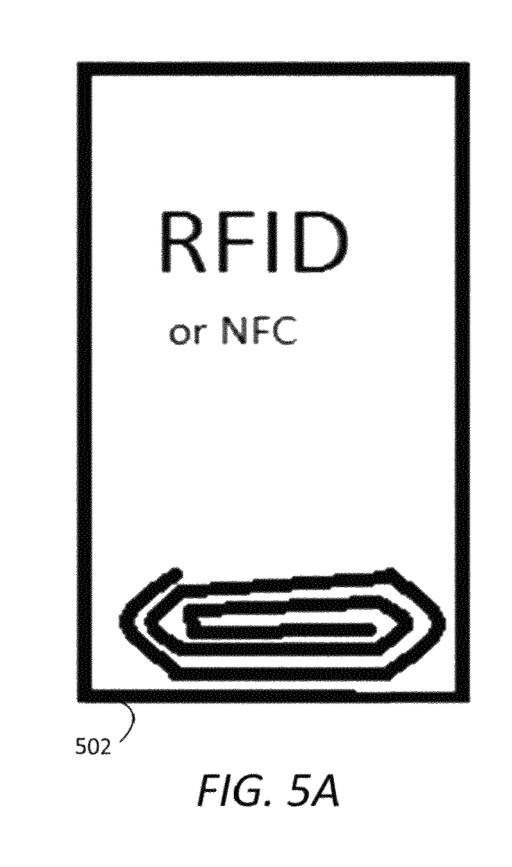
FIGS. 5A, 5B and 5C are exemplary diagrams illustrating overlays and various types of storage media for use with the wall controller in the lighting system of FIG. 1.
Figure 5B:
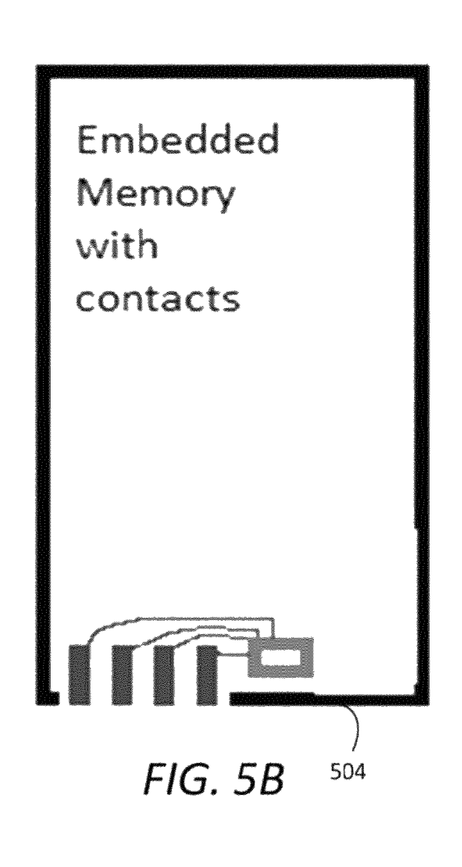
Figure 5C:
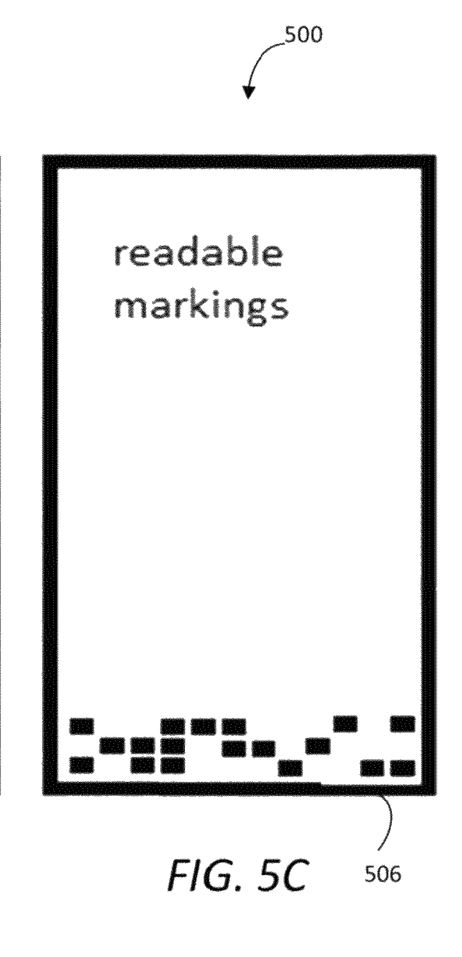

FIGS. 5A, 5B, and 5C are exemplary diagrams illustrating overlays and various types of storage media for the wall controller in the lighting system of FIG. 1. As stated above, the term "wall controller" encompasses any type of device, component, or combination that communicates with a lighting system to control operations of luminaires, and is not limited to wall mounting. Using a configuration of touch sensing and gesture sensing electrodes as described in FIG. 4, a configurable or customized overlay can be created for the wall controller in the lighting system of FIG. 1. The configurable overlay can be interchangeable as the user interface for input to the wall controller. For example, a front surface of the overlay 106 which is visible to a user of the wall controller may include labeling or graphics to indicate to the user the functions of buttons or gestures required to operate or input information for the lighting system such as turning the system on/off, dimming, light color changes, etc. The storage media may be integrally connected to and located on a rear surface of the overlay. The storage media contains the firmware (which can be digital data or analog data format) and program code for the functions of the buttons or gestures required for the layout of the overlay. The storage media may also be separate from the overlay and connected to the rear surface of the overlay. Information or instructions to identify the functions of the overlay with reference to the electrodes 104 are read, converted to digital format, when necessary, by a media reader 103 in FIG. 1, and transmitted to the gesture sense driver/controller 108 and touch sense driver/controller 110 to aid in detection and function of the user's sensed touch and gesture motions with the wall controller. In an alternative embodiment, the storage media may contain an identification character or code to provide access to remote firmware or updates containing information or instructions to identify the function of the overlay with reference to the electrodes 104 that are transmitted to the gesture sense driver/controller 108 and touch sense driver/controller 110. For example, the identification character or code may be used to download or install firmware from a networked server or a local commissioning device to provide information and instructions to identify the functions of the overlay with reference to user input sensed by the electrodes 104.

FIG. 5A illustrates an example of an overlay 502 that is illustrated as transparent for ease of explanation herein, but would have customized labeling on a front surface and storage media, such as a radio frequency identification (RFID) or a near field chip (NFC), located on a rear surface of the overlay to store firmware required to recognize a predetermined function of the sensed touch and gesture motions of a user of the wall controller.

FIG. 5B illustrates an example of an overlay 504 that is illustrated as transparent for ease of explanation herein, but would have customized labeling on a front surface and storage media such as embedded memory with contacts located on a rear surface of the overlay to store firmware required to recognize a predetermined function of the sensed touch and gesture motions of a user of the wall controller.

FIG. 5C illustrates an example of an overlay 506 that is illustrated as transparent for ease of explanation herein, but would have customized labeling on a front surface and storage media such as readable markings located on a rear surface of the overlay to store firmware required to recognize a predetermined function of the sensed touch and gesture motions of a user of the wall controller.

In each of FIGS. 5A, 5B, and 5C, the overlay is transparent to more clearly illustrate the storage media that may be integrally connected or configured separate from the overlay, and located on the rear surface of the overlay. When the wall controller 101 of the lighting system of FIG. 1 is configured with an overlay 502, 504, 506 having a configuration such as in FIG. 5A, 5B or 5C, the firmware (digital data or analog data) stored in storage media on the rear surface of the overlay is read by a media reader 103 and used by other components within the wall controller in the lighting system to detect, analyze and perform the desired control functions of the light sources based upon the sensed touch and gesture motions of the user of the wall controller and lighting system. Although the storage media in FIGS. 5A, 5B and 5C is shown in a bottom portion of the overlay 502, 504, 506, the storage media may be arranged on any area of the rear surface of the overlay that would permit a connection to the media reader. When the firmware is an analog format, the media reader 103 includes an analog to digital converter (ADC) to convert the analog data to digital data.

Figure 6A:
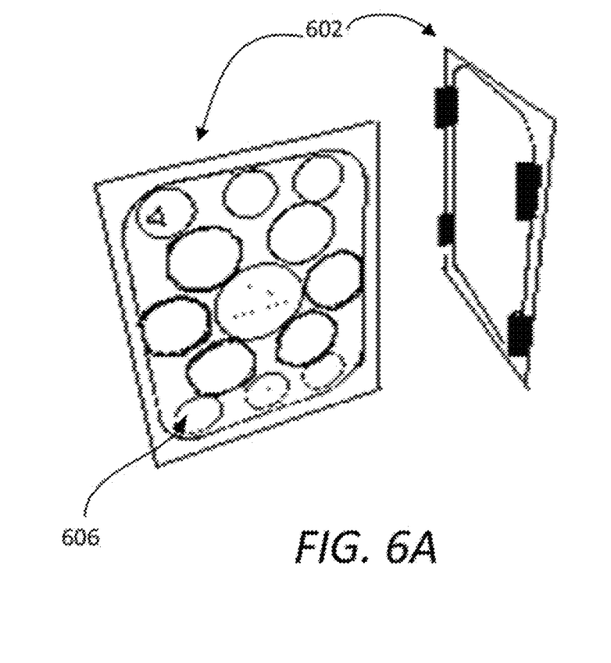
FIGS. 6A and 6B provide front and side views of the configurable overlay and a front plate of the wall controller in the lighting system of FIG. 1.
Figure 6B:
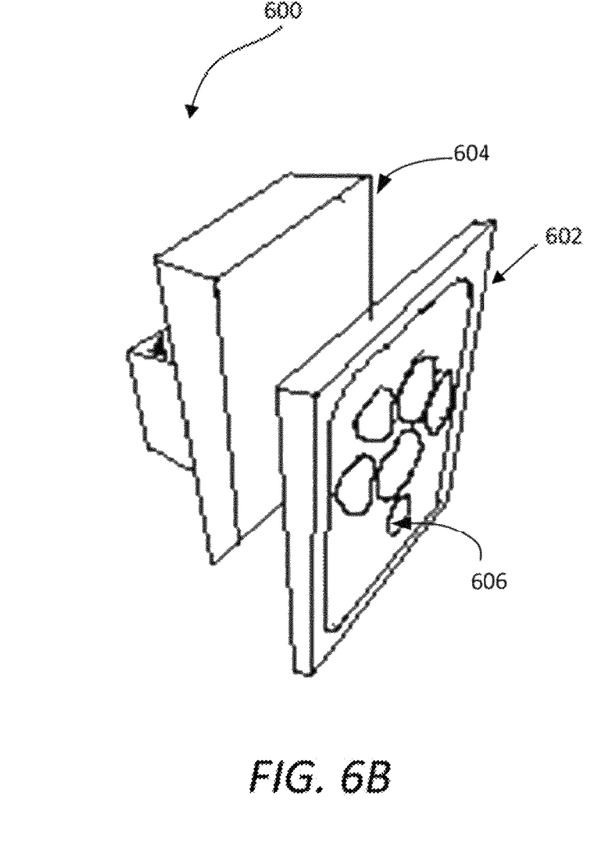

FIGS. 6A and 6B provide front and side views of the configurable overlay, a front plate and wall controller in the lighting system of FIG. 1. In FIG. 6A, the overlay 606 includes customized labeling and a front plate 602 to be placed over the overlay 606 to secure the overlay 606 to a surface of the wall controller. FIG. 6B illustrates a view of the front plate 602 positioned on the overlay 606 prior to securing the overlay 606 to a surface of the wall controller 604.

Figure 7A:
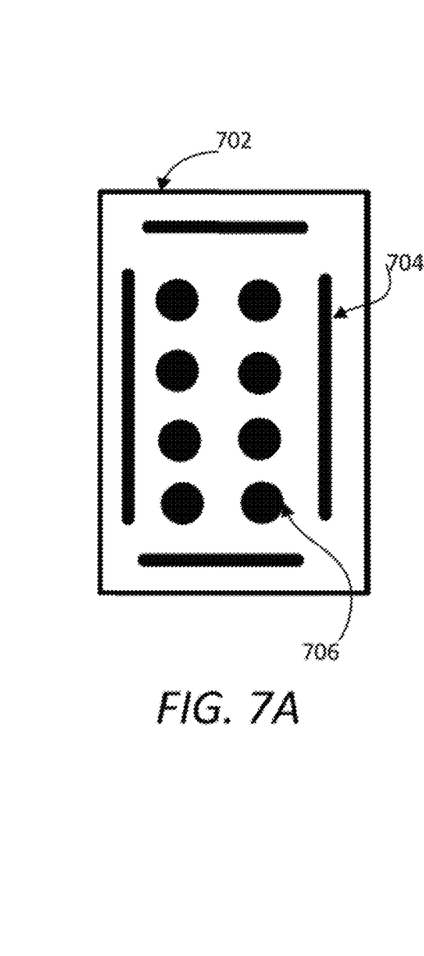
FIGS. 7A, 7B, 7C and 7D are simplified diagrams illustrating the stack-up assembly of the wall controller for the lighting system of FIG. 1.
Figure 7B:
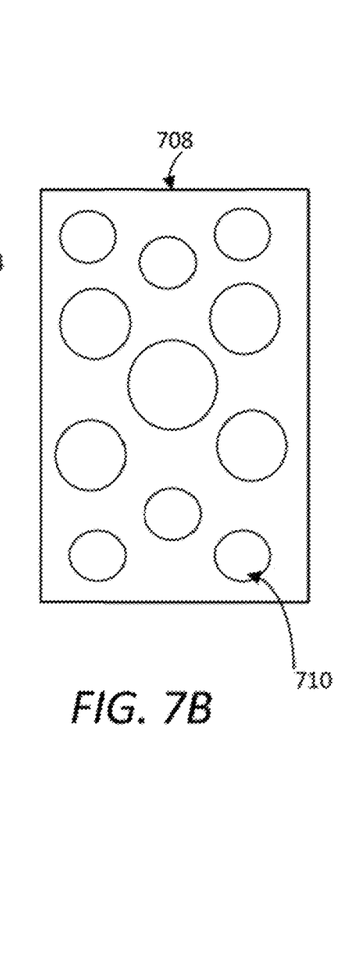
Figure 7C:
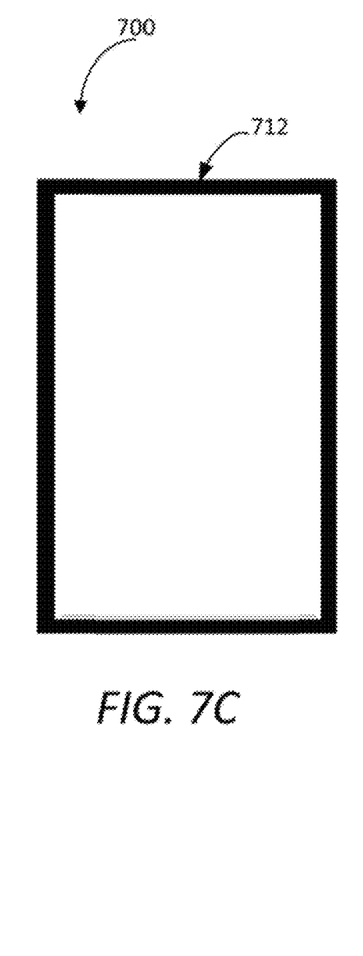
Figure 7D:
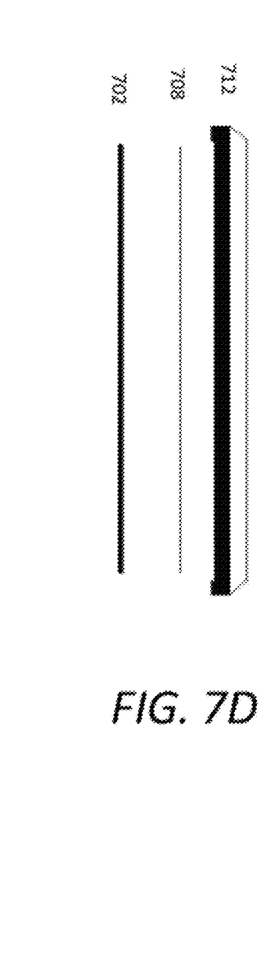

FIGS. 7A, 7B, 7C, and 7D are simplified diagrams illustrating the stack-up assembly for the wall controller 101 in the lighting system of FIG. 1. FIG. 7A illustrates the substrate 702 having touch sensing capacitive electrodes 706 and gesture sensing electrodes 704 arranged thereon. FIG. 7B illustrates the overlay 708 having customized graphics 710 thereon. The customized graphics include any alphanumeric or numeric characters, shapes or designs that may functionally identify to a user an area of the overlay to input a desired lighting function. FIG. 7C is a transparent front plate 712 positioned over the overlay 708 to secure the overlay 708 to the wall controller. The front plate 712 is made of any rigid or semi-rigid material to secure the overlay 708 to a surface of the wall controller as well as to permit visual and tactile access to the overlay 708. FIG. 7D illustrates the complete stack-up for the substrate 702, overlay 708 and the front plate 712 of the wall controller 101.

Figure 8:
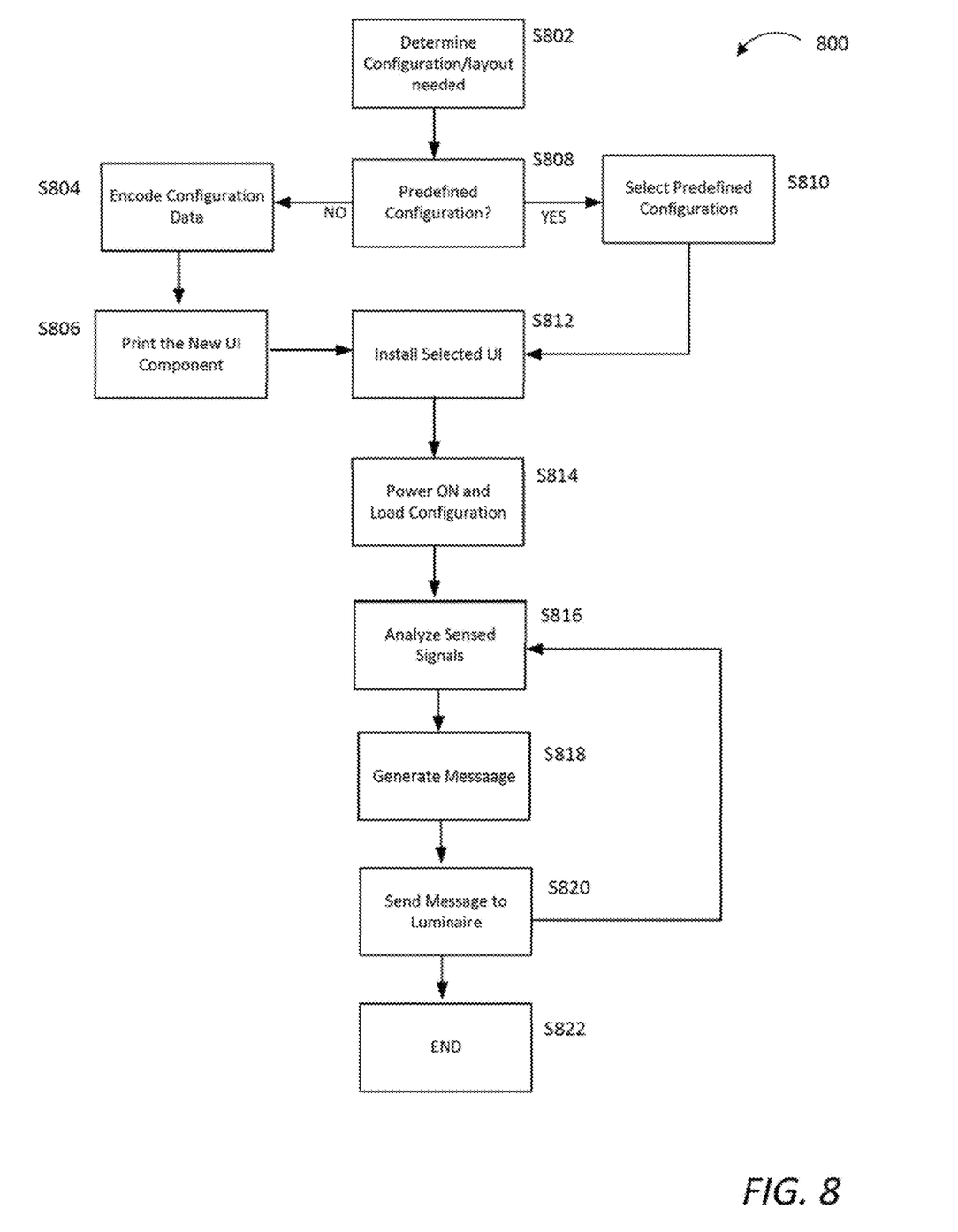
FIG. 8 is a flow chart illustrating a process for controlling one or more luminaires in an area of a wall controller in accordance with sensing signals from user touch and motion gestures at a configurable overlay of a wall controller.

FIG. 8 is a flow chart illustrating a process of controlling one or more luminaires in an area of a wall controller in accordance with sensing signals from user touch and motion gestures at a configurable overlay on the wall controller in the lighting system illustrated in FIG. 1.

Beginning at S802, a decision is made regarding a configuration or layout of buttons or inputs that is needed for the wall controller to control luminaires in the lighting system.

At S808, after the configuration for the wall controller is determined, a next determination is made regarding whether the configuration needed from S802 is a predefined configuration for which the user has access to pre-printed overlays and front plates that can be used on the wall controller for the needed lighting functions configuration. If YES, the configuration is predefined and accessible to the user, then at S810, the user selects the overlay and front plate having the predefined configuration for use with the wall controller, and the process continues to S812.

If NO, the needed configuration is not predefined and the user does not have access to an overlay having the configuration needed, then at S804, a customized overlay is designed by encoding the necessary configuration data in either digital or analog format, and saving the data to storage media, as well as creating labeling or a layout for the visual and tactile layout. At S806, the customized labeling for the overlay and the storage media having the encoded data and configuration information for S802 is printed. The process continued to S812.

At S812, the overlay 708 having the printed user interface labeling from S806 or predefined configuration of S810 adhered thereto is installed with the front plate on a surface of the wall controller.

At S814, the system is powered ON, and the configuration of the overlay 708, i.e., the predetermined lighting functions corresponding to the arrangement of touch sensing and gesture sensing electrodes, is loaded from the storage media located on the rear surface of the overlay, i.e., the firmware stored in the storage media is read by a media reader such as reader 103 arranged on the substrate 102.

At S816, sensed signals from the touch sensing capacitive electrodes and the gesture sensing electrodes are analyzed based upon the data received from the firmware to indicate a desired lighting function. The sensed signals include capacitive touches received by the touch sense driver/controller 110, and gestures or movements that are sensed by gesture sense driver/controller 108. The sensed signals are sent to MCU 114. The CPU 120 of the MCU 114 analyzes the sensed signals using programming stored at memory 122.

At S818, a control message for lighting control is generated based upon the analysis of the sensed signals from the gesture sense driver/controller and touch sense driver/controller using the firmware stored in media storage on a rear surface of the configurable overlay and transmitted to the memory 122 of the MCU 114.

At S820, the control message is transmitted to luminaire 112 to control the luminaire to perform a light function corresponding to the sensed touch and gesture input from a user at the configurable overlay of the wall controller. After the control message is transmitted, if there are additional sensed signals, the process returns to S816 to analyze the sensed signals from the touch sensing capacitive electrodes and the gesture sensing electrodes.

When there are no new sensed signals, the process ends at S822.

Program aspects of the technology may be thought of as "products" or "articles of manufacture" typically in the form of executable code and/or associated data that is carried on or embodied in a type of machine readable medium. For example, programming code could include code for the CPU or the processor of the wall controller, luminaire or gateway server, as well as firmware and software for the overlay of the wall controller. "Storage" type media include any or all of the tangible memory of the computers, processors, luminaires, wall controller or the like, or associated modules thereof, such as various semiconductor memories, tape drives, disk drives and the like, which may provide non-transitory storage at any time for the software programming. All or portions of the software may at times be communicated through the Internet or various other telecommunications networks. Such communications, for example, may enable loading of the software from one computer or processor into another, for example, from a management server or host computer of the service provider into the computer platforms of the media gateway and client device, or the loading of program code to the MCU of the wall controller for coordination with the storage media of the overlay. Thus, another type of media that may bear the programming, media content includes optical, electrical and electromagnetic waves, such as used across physical interfaces between local devices, through wired and optical landline networks and over various air-links. The physical elements that carry such waves, such as wired or wireless links also may be considered as media bearing the software. As used herein, unless restricted to "non-transitory", "tangible", or "storage" media, terms such as computer, storage medium or machine "readable medium" refer to any medium that participates in providing instructions or data to a processor for execution.

Hence, a machine readable medium may take many forms of tangible storage medium. Non-volatile storage media include, for example, optical or magnetic disks, such as any of the storage devices in any computer(s) or the like, such as may be used to implement the devices including the wall controller, or gateway, shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example, floppy disks, a flexible disk, hard disk, magnetic tape or other magnetic medium, a CD-ROM, DVD or DVD-ROM, any other optical medium, punch cards paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequence of one or more instructions to a processor for execution.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirements of Sections 101, 102, or 103 of the Patent Act, nor should they be interpreted in such a way. An unintended embracement of such subject matter is hereby disclaimed.

Except as stated immediately above, nothing that has been stated or illustrated is intended or should be interpreted to cause a dedication of any component, step, feature, benefit, or advantage to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises or includes a list of elements or steps does not include only those elements or steps but may include other elements or steps not expressly listed or inherent to such process, method, article, or apparatus. An element preceded by "a" or "an" does not, without further constraints, preclude the existence of additional identical elements in the process, method, article, or apparatus that comprises the element.

Unless otherwise stated, any and all measurements, values, ratings, positions, magnitudes, sizes, and other specifications that are set forth in this specification, including in the claims that follow, are approximate, not exact. Such amounts are intended to have a reasonable range that is consistent with the functions to which they relate and with what is customary in the art to which they pertain. For example, unless expressly stated otherwise, a parameter value or the like may vary by as much as ±10% from the stated amount.

In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, the subject matter to be protected lies in less than all features of any single disclosed example. Thus the following claims are hereby incorporated into the Detailed Description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. A wall controller for lighting, comprising:
    a substrate;
    touch sensing electrodes mounted to the substrate;
    a capacitive touch driver and sensing circuit coupled to the touch sensing electrodes;
    gesture sensing electrodes mounted to the substrate;
    a capacitive gesture driver and sensing circuit coupled to the gesture sensing electrodes;
    an interchangeable overlay mounted over the touch sensing and gesture sensing electrodes, wherein the overlay includes storage media configured on a rear surface of the overlay to accommodate firmware to define lighting functions relative to a touch or motion gesture on the overlay to provide a configurable user interface of the wall controller, and at least one of labeling or graphics visible to a user of the wall controller to indicate to the user touches or gestures required to input information for control of one or more luminaires;
    a lighting network data communication interface;
    a processor coupled to receive at least one of sensing signals, based upon user touch inputs at a location on the overlay and defined by the firmware of the overlay, from the capacitive touch driver and sensing circuit or sensing signals, based upon user motion gestures of a type near the overlay and defined by the firmware of the overlay, from the capacitive gesture driver and sensing circuit;
    memory coupled to be accessible to the processor; and
    programming in the memory, wherein the memory stores the programming for execution by the processor and data to be saved or processed by the processor during execution of instructions included in the programming,
    wherein execution of the programming in the memory configures the processor to:
        analyze the at least one sensing signals received from the capacitive touch and gesture drivers and sensing circuits in accordance with the firmware of the overlay;
        generate a lighting control message based upon the analyzed sensing signals; and
        transmit the lighting control message to the one or more luminaires in an area of the wall controller to control an output of the one or more luminaires.

2. The wall controller of claim 1, wherein the execution of the programming by the processor to perform the function to analyze the at least one sensing signals includes:
    ascertaining from which of the touch sense or gesture sensing electrodes a user input was sensed to generate the sensing signals; and
    determining a function of the sensed user input based upon a predetermined configuration of the touch sensing and gesture sensing electrodes and the firmware of the overlay.

3. The wall controller of claim 1, wherein the processor includes a wireless transceiver and is coupled to the lighting network data communication interface, and wherein the interface is configured to provide data communications via a data communications network.

4. The wall controller of claim 3, wherein the data communications network is a wireless network and is configured to enable data communication within the area of the wall controller and to provide data communication access to a wide area network extending outside the area.

5. The wall controller of claim 4, wherein the data communications network uses at least one of Bluetooth Low Energy (BLE), sub-GHz, Z-wave, LiFi or WiFi protocol.

6. The wall controller of claim 1, wherein the touch sensing electrodes are arranged in a central area of the substrate.

7. The wall controller of claim 1, wherein at least four gesture sensing electrodes are arranged at a perimeter of the substrate.

8. The wall controller of claim 7, further including a gesture sensing electrode arranged in a central area of the substrate.

9. The wall controller of claim 1, wherein the storage media is integrally connected to the overlay.

10. A system, comprising:
a data network;
a plurality of luminaires, comprising:
a light source;
driver circuitry coupled to the light source to provide power to the light source;
a lighting control device coupled to the driver circuitry to control a light output and operations of the light source; and
a network interface to enable the light fixture to receive communication via the data network; and
a wall controller configured for mounting in a standard electrical box through an opening in a structural architectural panel, wherein the wall controller comprises:
a substrate;
touch sensing electrodes mounted to the substrate;
a capacitive touch driver and sensing circuit coupled to the touch sensing electrodes;
gesture sensing electrodes mounted to the substrate;
a capacitive gesture driver and sensing circuit coupled to the gesture sensing electrodes;
an interchangeable overlay mounted over the touch sensing and gesture sensing electrodes, wherein the overlay includes storage media configured on a rear surface of the overlay to accommodate firmware to define lighting functions relative to a touch or motion gesture on the overlay to provide a configurable user interface of the wall controller, and at least one of labeling or graphics visible to a user of the wall controller to indicate to the user touches or gestures required to input information for control of one or more luminaires of the plurality of luminaires;
a lighting network data communication interface to enable the wall controller to communicate with the plurality of luminaires;
a processor coupled to receive at least one of sensing signals, based upon user touch inputs at a location on the overlay plate and defined by the firmware of the overlay, from the capacitive touch driver and sensing circuit or sensing signals, based upon user motion gestures of a type near the overlay and defined by the firmware of the overlay, from the capacitive gesture driver and sensing circuit;
memory coupled to be accessible to the processor; and
programming in the memory, wherein the memory stores the programming for execution by the processor and data to be saved or processed by the processor during execution of instructions included in the programming,
wherein execution of the programming in the memory configures the processor to:
analyze the at least one sensing signals received from the capacitive touch and gesture drivers and sensing circuits in accordance with the firmware of the overlay;
generate a lighting control message based upon the analyzed sensing signal; and
transmit the lighting control message to one or more of the luminaires in an area of the wall controller to control the output of the light source of the one or more luminaires.

11. The system of claim 10, wherein the execution of the programming by the processor to perform the function to analyze the at least one sensing signals includes:
ascertaining from which of the touch sense or gesture sensing electrodes a user input was sensed to generate the sensing signals; and
determining a lighting function of the sensed user input based upon a predetermined lighting profile configuration of the touch sensing and gesture sensing electrodes and the firmware of the overlay.

12. The system of claim 10, wherein a wired network is formed via wired links between each of the plurality of luminaires, the wall controller and the data network.

13. The system of claim 10, wherein the network interfaces of each of the plurality of luminaires and the wall controller comprises a wireless transceiver.

14. The system of claim 13, wherein the data network is a wireless network formed by the wireless transceivers of the plurality of luminaires and the wall controller, and
the data network is configured to enable data communication within the area of the wall controller and to provide data communication access to a wide area network extending outside the area.

15. The system of claim 14, wherein the data communication uses at least one of WiFi, Bluetooth Low Energy (BLE), Z-wave, sub-GHz, LiFi protocol.

16. The system of claim 10, wherein the touch sensing electrodes of the wall controller are arranged in a central area of the substrate.

17. The system of claim 10, wherein at least four gesture sensing electrodes of the wall controller are arranged at a perimeter of the substrate.

18. The system of claim 17, further including a gesture sensing electrode arranged in a central area of the substrate of the wall controller.

19. The system of claim 10, wherein the storage media is integrally connected to the overlay.

20. A method for controlling lighting, comprising:
receiving at least one of sensing signals, based upon user touch inputs at a location on an interchangeable overlay mounted over touch sensing and gesture sensing electrodes of a wall controller and defined by firmware of the overlay, from a capacitive touch driver and sensing circuit or sensing signals, based upon user motion gestures of a type near the overlay and defined by the firmware of the overlay to provide a configurable user interface for the wall controller, wherein the overlay includes storage media configured on a rear surface of the overlay to accommodate the firmware to define lighting functions relative to a touch or motion gestures on the overlay, and at least one labeling or graphics visible to a user of the wall controller to indicate to the user the touches or gestures required to input information for the control of at least one of a plurality of luminaires in an area;

analyzing the at least one sensing signals received from the capacitive touch driver and capacitive sensing circuit or the capacitive gesture driver and sensing circuit, wherein the analyzing comprises:

ascertaining from which of the touch sensing electrodes or the gesture sensing electrodes the user input was sensed to generate the sensing signals, wherein the touch sensing electrodes and gesture sensing electrodes are mounted to a substrate of a wall controller configured for mounting in a standard electrical box through an opening in a structural architectural panel; and determining a lighting function of the sensed user input based upon a predetermined lighting profile configuration of the touch sensing and gesture sensing electrodes and the overlay;

generating a lighting control message based upon the analyzed sensing signals; and transmitting the lighting control message to the at least one of the plurality of luminaires in the area to control an output from a light source of the at least one of the plurality of luminaires.

21. The method of claim 20, wherein determining the function of the sensed user input includes retrieving the defined function from the storage media configured to accommodate the internal firmware on the overlay.

22. The method of claim 20, wherein the storage media is integrally connected to the overlay.

23. The method of claim 20, wherein the touch sensing electrodes are arranged in a central area of the substrate, and wherein the central area of the substrate corresponds to a central area of the overlay.

24. The method of claim 20, wherein at least four gesture sensing electrodes are arranged at a perimeter of the substrate, and wherein the perimeter of the substrate corresponds to a perimeter of the overlay.

25. The method of claim 24, further including a gesture sensing electrode arranged in a central area of the substrate, wherein the central area of the substrate corresponds to a central area of the overlay.

* * * * *